United States Patent [19]

Pedder

[11] Patent Number: 5,022,580
[45] Date of Patent: Jun. 11, 1991

[54] VERNIER STRUCTURE FOR FLIP CHIP BONDED DEVICES

[75] Inventor: David J. Pedder, Oxon, Great Britain

[73] Assignee: Plessey Overseas Limited, Ilford, England

[21] Appl. No.: 435,477

[22] PCT Filed: Mar. 16, 1989

[86] PCT No.: PCT/GB89/00282
§ 371 Date: Nov. 30, 1989
§ 102(e) Date: Nov. 30, 1989

[87] PCT Pub. No.: WO89/08926
PCT Pub. Date: Sep. 21, 1989

[30] Foreign Application Priority Data

Mar. 16, 1988 [GB] United Kingdom ............... 8806232
May 16, 1988 [GB] United Kingdom ............... 8811529

[51] Int. Cl.⁵ .............................................. H05K 3/34
[52] U.S. Cl. ................................. 228/56.3; 228/56.5; 228/254; 29/834; 437/209; 357/65
[58] Field of Search ...................... 228/179, 180.2, 103, 228/104, 105, 9, 56.5, 56.3; 29/833, 834; 437/209; 156/64; 357/80, 65, 74

[56] References Cited

U.S. PATENT DOCUMENTS 3,811,186  5/1974  Larnerd et al. ................ 228/180.2
4,878,611 11/1989  LoVasco et al. ............... 228/180.2

FOREIGN PATENT DOCUMENTS 0126621 11/1984  European Pat. Off. .
8701509  3/1987  European Pat. Off. ......... 228/180.2
1273515  5/1972  United Kingdom .
2045523 10/1980  United Kingdom .
2073950 10/1981  United Kingdom .

OTHER PUBLICATIONS

IBM Technical Disclosure Bulletin, "Split Field Alignment Marks", vol. 18, No. 10, p. 3306, Mar. 1976.
Micro Electronic Engineering, vol. 6, No. 1-4, R. Patovan et al., "Alignment Markers ...", pp. 117-122, Dec. 1987.

Primary Examiner—Sam Heinrich
Attorney, Agent, or Firm—Fleit, Jacobson, Cohn, Price, Holman & Stern

[57] ABSTRACT

A flip-chip solder bonding structure having first and second components. Each component is made from a substrate haivng on one surface an array of solderable pads. Selected pads have solder bumps deposited thereon with each surface having a plurality of alignment marks formed thereon whereby when the components are positioned face to face, the arrays register with one another to enable a solder bond to be formed. The respective pluralities of alignment marks may be inspected to assess their relative positions in order to determine the accuracy of the solder bond. The solderable pads and the alignment marks on each surface are formed during the same processing stage as metallized regions. The solder bumps are applied to the metallized regions forming the alignment marks.

7 Claims, 4 Drawing Sheets

VERNIER STRUCTURE FOR FLIP CHIP BONDED DEVICES

This invention relates to a flip-chip solder bond arrangement having means for determining the alignment of the components thereof.

Flip chip solder bonding is now attracting significant attention as a means of providing very high density area interconnections between a chip and a substrate, as a bonding technique with very attractive electrical characteristics (low inductance and capacitance) for high speed electronic devices and as a method of acheiving very precise alignment and separation of components for micro-optical or related applications.

As illustrated schematically in FIG. 1, in a flip-chip solder bonding, it is usually necessary to provide an integrated circuit chip 2 and a substrate component 4 (which may itself be a chip) each of which comprises a substrate having on one surface thereof a mating array of solderable metallisation pads 6, 8 typically using CrCuAu multilayer metallisation), and either or both of which are provided with solder bumps 10 over the solderable pads (typically using 95Pb:5Sn or 63Sn:37Pb solders (wt%)). This basic structure is well known. To bond the two components, the components 2, 4 are first aligned to within the accuracy required for the solder bumps 10 to contact the corresponding wettable pad 8 or bumps ($\sim\frac{1}{2}$ a pad diameter). The assembly is then raised above the melting point of the solder involved under inert or reducing conditions. The solder wets the wettable metallisation and surface tension forces then act to pull the two components into very accurate final alignment. The bonded assembly is then cooled to form a solidly bonded hybrid device structure. The final, equilibrium bond shape and spacing of the two components is controlled by the balance of surface tension and gravitational forces at the bonding temperature, and can readily be calculated for a regular array of circular bonds, knowing the individual solder bump volumes, wettable pad sizes, chip mass and solder surface tension. For large bond arrays with circular wettable pads and for low chip masses, the final solder bond geometry is that of a doubly truncated sphere, making calculation particularly straightforward. The processes of bonding and the forces acting at the bonding temperature are illustrated schematically in FIGS. 2 and 3. It should be noted that the solder to form the bumps may be applied over areas larger than that of the wettable metallisation, using a variety of masking techniques, to provide a controlled 'dewet' ratio and allow independent control of solder bump heights from a uniform solder coating thickness, as illustrated in FIG. 4.

Having produced a flip chip solder bonded hybrid device, it is then of interest to determine whether that hybrid device has been successfully bonded. The very nature of the flip chip bonded device, with its face-to-face bonded configuration, makes conventional visual or optical microscopy inspection difficult, even where an optically transparent chip is involved since the wettable metallisation itself obscures the major area of the bond.

The major criterion for successful bonding of microelectronic devices is that an ohmic electrical connection has been acheived at every bond site, whereas, for the micro-optical devices, the criterion of success is that the two components have become aligned to the required accuracy. While the direct checking of the bond electrical characteristics can usually only easily be accomplished by a functional electrical assessment. A method that provides quantitative information on the success of the solder wetting and surface tension self alignment processes during the bonding operation must provide a very high degree of confidence that the bonding process itself has been successful. Such a method, coupled with bump height and height uniformity measurements prior to assembly and other related checks (for example monitoring the ohmic nature of the wettable metal to silicon input pad connection), then provides the basis of a viable inspection procedure for monitoring production of flip chip bonded devices. In the case of a micro-optical device, the measurement of bump heights and height uniformities, together with the quantitative measurement of component alignment is entirely sufficient to establish successful bonding.

Methods assessed to date for inspection of flip chip bonded devices have included X-ray radiography and acoustic microscopy. The former method provides a useful, qualitative method to assess bond shape and to inspect for stray solder or voids in solder bonds but does not provide quantitative alignment data. With real time equipment it can be a rapid inspection method. The latter method can provide relatively low resolution bond images and assess bond mechanical integrity, but is a relatively slow process, unsuited for in-line inspection.

It is an object of the present invention to provide a means for rapidly inspecting the bond in a flip-chip solder bonding arrangement.

The present invention provides a flip-chip solder bonding arrangement comprising first and second components each comprising a substrate having on one surface an array of solderable pads, selected pads having solder bumps deposited thereon, and each surface having a plurality of alignment marks formed thereon whereby when the components are positioned face to face, the arrays register with one another to enable a solder bond to be formed, and the respective pluralities of alignment marks may be inspected to assess their relative positions in order to determine the accuracy of the solder bond.

In accordance with the invention the alignment marks may be formed as metallised areas in the same process as the formation of a metallised array of solderable pads. Where the substrate or substrates are transparent to light or infra-red radiation, visual inspection can be carried out of the alignment marks. However if the substrate or substrates are opaque to light, then X-ray inspection techniques are required, and small quantities of solder or other X-ray absorbent material are deposited on the metallised alignment marks to enable an X-ray inspection procedure.

At its simplest, the alignment marks may simply be arranged for one to one registration so that when the marks appear in alignment, this will be indicative of the accuracy of the bond. However the accuracy of this arrangement is limited particularly for X-ray inspection techniques where it is not normally possible to achieve resolution better than 5 μm, whereas the solder bond may be required to be accurate to 1 μm, or less.

Another technique would be to provide a row of alignment marks on each substrate positioned that the rows appear intercalated or interdigitated when the bond is formed. Thus when the bond is properly formed the intercalated rows would provide a uniformly dark image whereas if the bond is inaccurately formed, the image would provide lighter regions with the periodicity of the spacing between the marks. This would be a more accurate method than simple alignment marks.

However in a preferred arrangement, rows of alignment marks are provided on each substrate with slightly different spacings and arranged so that when the bond is formed they provide a vernier measuring scale. Thus the marks may be inspected when the bond is formed and the marks identified which appear to be in alignment. The spacing of such aligned marks from a reference point indicates the degree of mismatch in the bond and provides a precise measure of the amount by which the substrates are misaligned. It is possible with this method to provide a measure within 2 $\mu$m, even where the marks themselves may not be individually resolved to better than 5 $\mu$m.

A preferred embodiment of the invention will now be described with reference to the accompanying drawings, in which.

Figure 1:
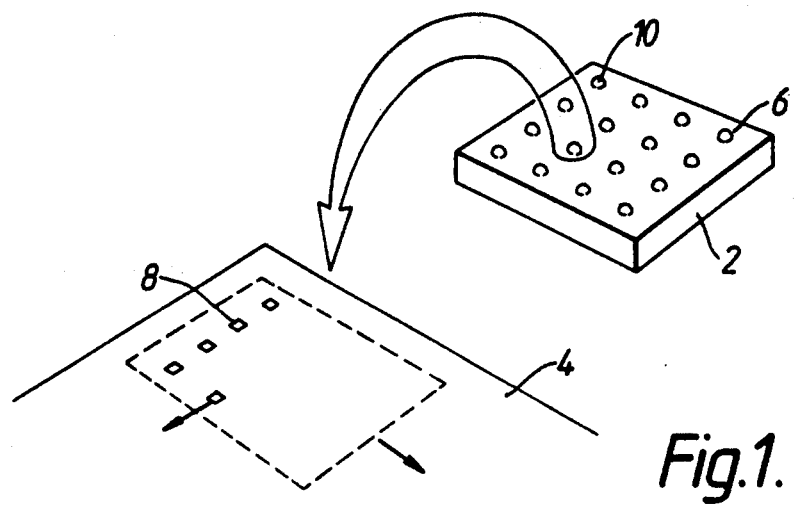
FIG. 1 is a schematic diagram of the known flip-chip solder bonding process.
Figure 2:
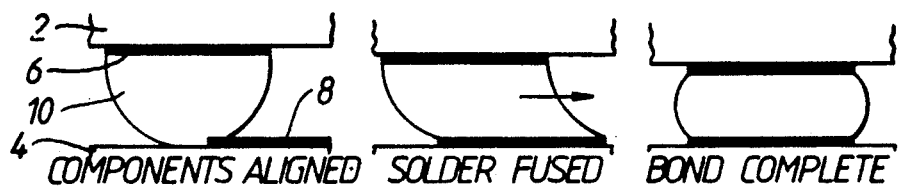
FIG. 2 is a schematic view illustrating how a solder bump preforms a self-aligning procedure during the formation of the solder bond.
Figure 3:
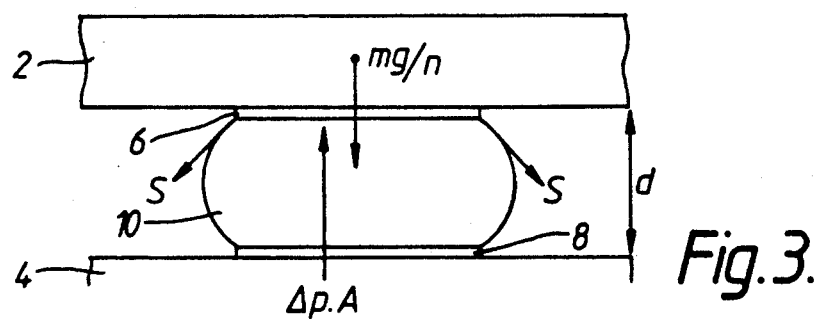
FIG. 3 is a view of a solder bond showing the various forces acting on a solder bump at the bonding temperature.
Figure 4:
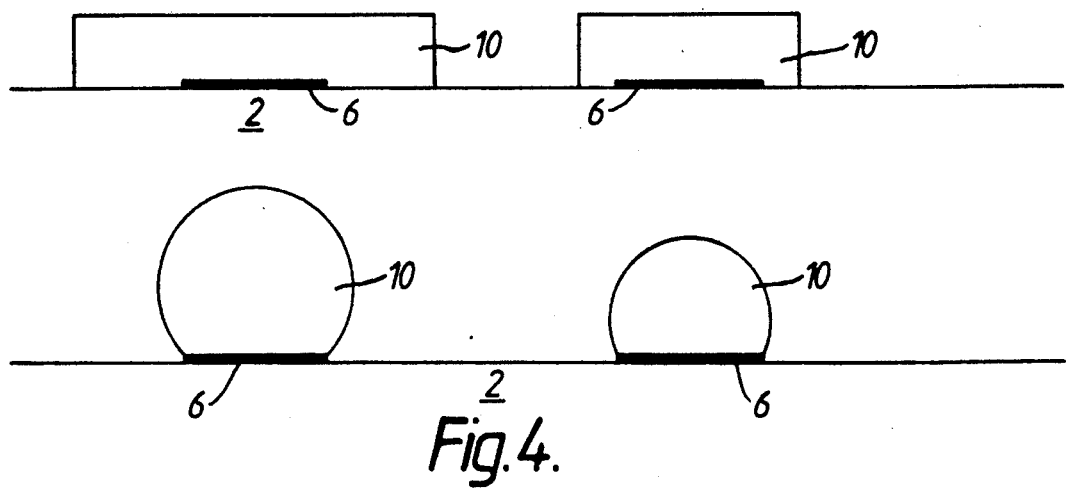
FIG. 4 illustrates a method by which the height of a solder bond is controlled.
Figure 5:
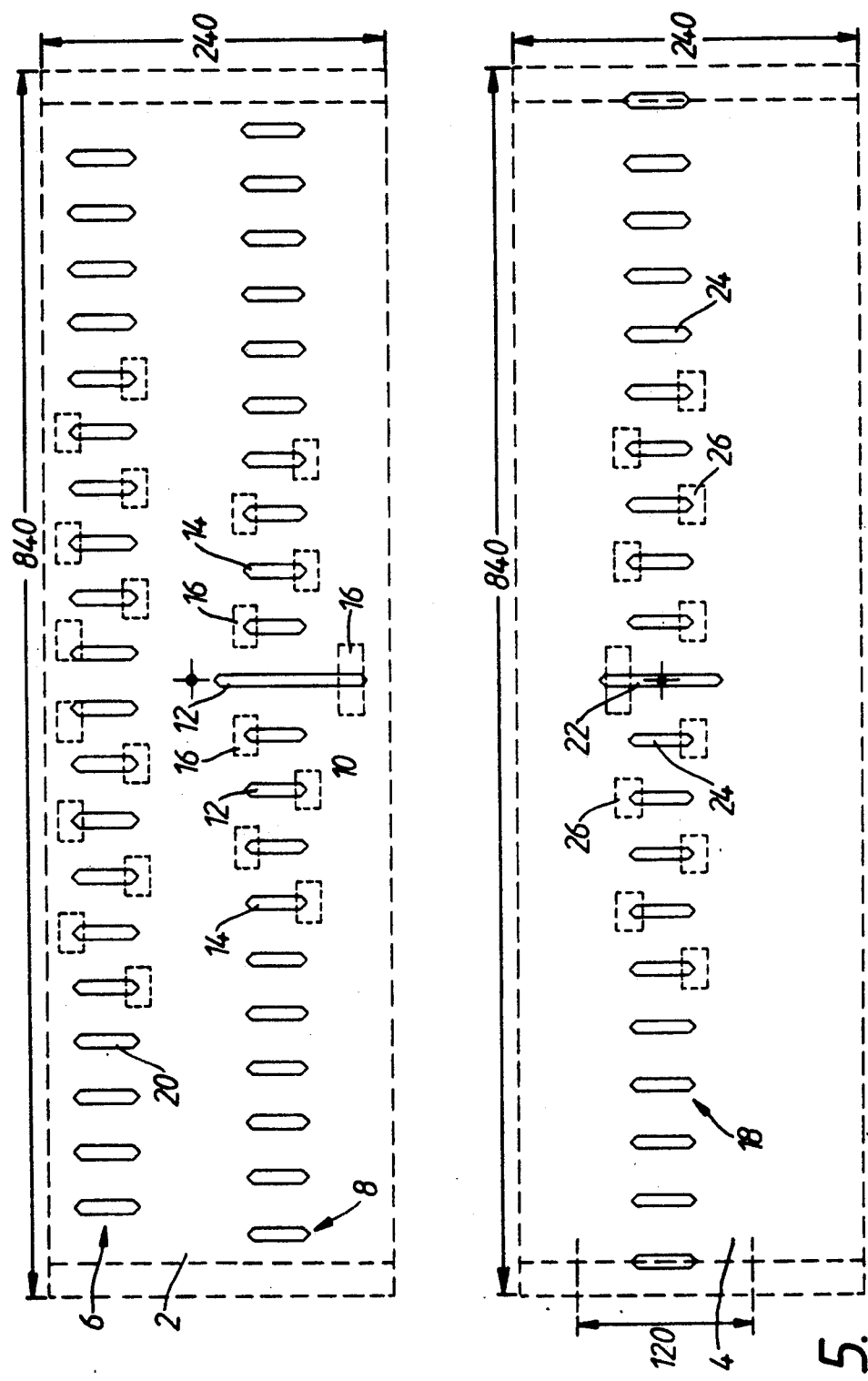
FIG. 5 is a plan view of surfaces of first and second components to be bonded together having alignment marks formed thereon as vernier scales, in accordance with the invention.
Figure 6:
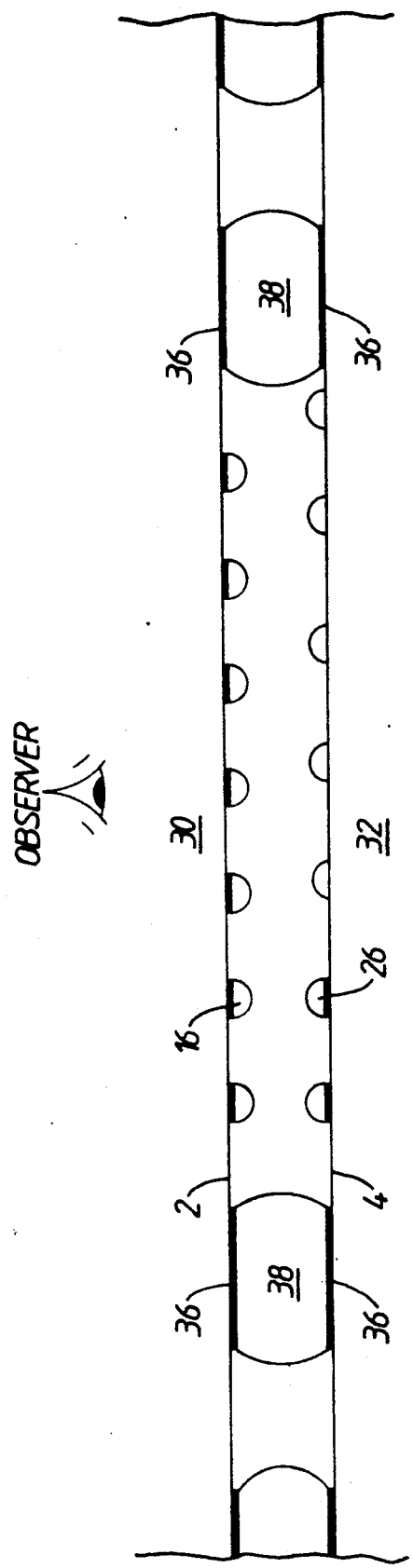
FIG. 6 shows a cross-sectional view of the vernier scale in a completed solder bond; and, FIG. 7 is a plan view of a component substrate surface having an array of solder pads formed thereon and four vernier scales in accordance with the invention.
Figure 7:
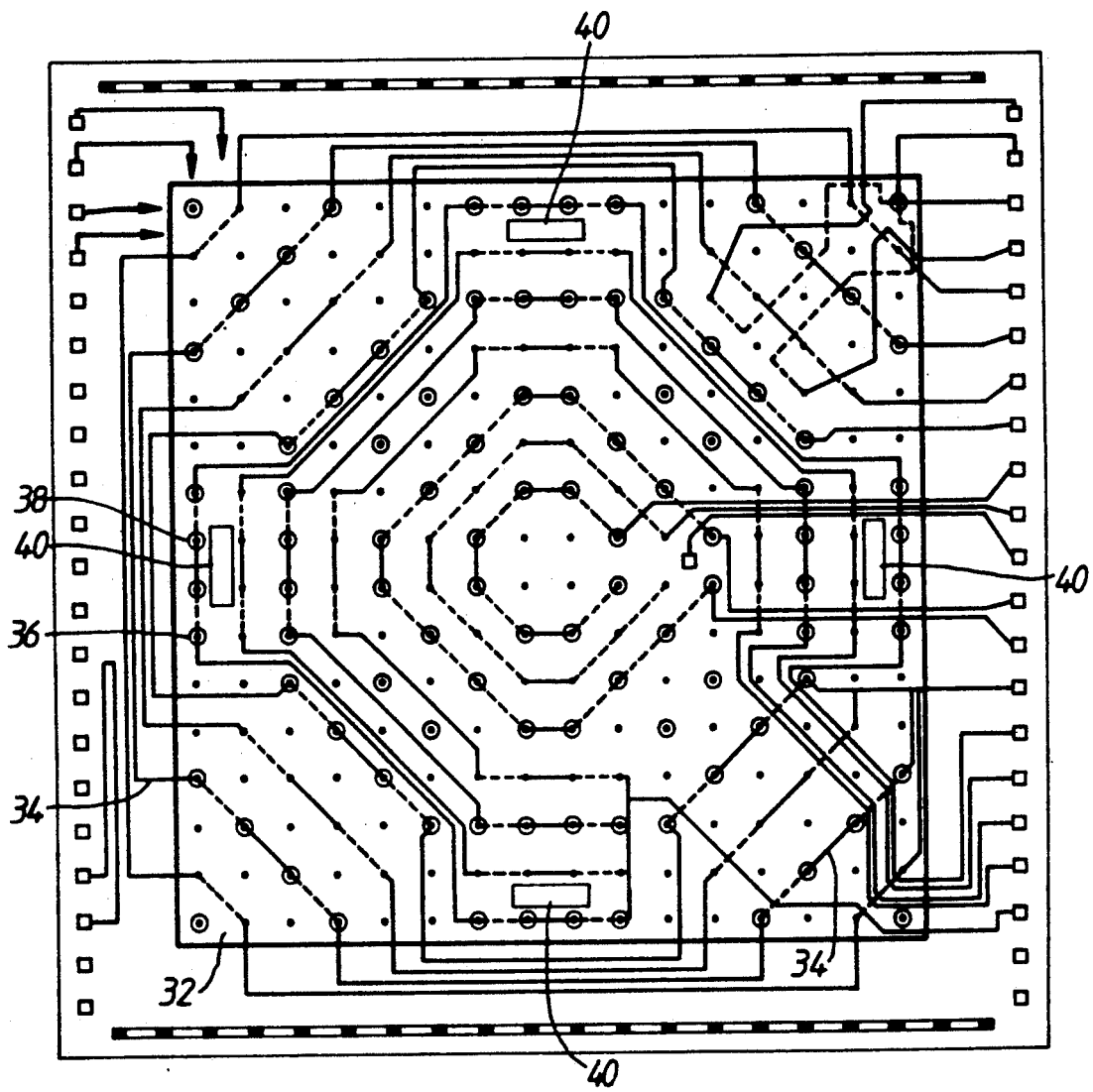

Referring now to FIGS. 5, 6 and 7 which illustrate a preferred embodiment of the invention, FIG. 5 shows part of a substrate 2 of a first component of a flip-chip solder bonded assembly (comprising an integrated circuit) and a part 4 of a surface of the substrate forming the other component of the flip-chip solder bonded assembly. The parts shown illustrate the vernier scales according to the invention, substrate 2 having two vernier scales 6, 8, scale 8 having a center mark 10 formed as a metallised bar 12 micrometers in width and 120 micrometers in length. The ends of the bar are pointed as at 12. The remaining bars 14 are also 12 micrometers in width but are shorter, being 50 micrometers long and are spaced apart from one another by distance of 40 micrometers. Each bar has a solder bump formed at one end of the bar as at 16, the solder bumps being in staggered relationship to one another so that solder bumps of the adjacent bars do not interfere with one another. The solder bumps are approximately 24 micrometers square. Scale 6 is spaced from scale 8 by a distance of 84 micrometers and comprises a series of bars 20 similar to bars 14 in every respect. The bars 20 are positioned relatively to bars 8 such that each bar 20 falls midway between two bars 8 in the direction of the scales.

Substrate surface 4 possesses a vernier scale 18 having a center bar 22 and side bars 24. Bar 22 is 12 micrometers in width and 100 micrometers in length, bars 24 are 12 micrometers in width and 48 micrometers in length and bars are spaced from one another by a distance of approximately 42 micrometers which is slightly larger than the 40 micrometers spacing of rows 6, 8. Bars 22, 24 are similarly formed with pointed ends and have solder pads 26 formed thereon in staggered relationship.

FIG. 7 shows a plan view of the two components of the solder bond assembly positioned in face-to-face relationship as comprising a silicon substrate 30 and an integrated circuit 32. Conduction lines 34 are provided on the silicon substrate surface to metallisation solder pads 36 which receive solder bumps 38 to form the solder bump bonding array. The vernier scales are shown in FIG. 5 are positioned on each side of the solder bump array as at 40.

Thus in an assembled solder bond, the scale 18 of surface 4 is positioned midway between scales 6 and 8 of surface 2. Assuming the substrate 30 and integrated circuit 32 to be opaque to visible light an X-ray inspection method will reveal the solder bumps 26, 16. A visual inspection technique will enable the viewer to determine which solder bumps are in alignment in the direction of the scales and thereby determine from the distance of such aligned solder bumps from the center point of the scales, the extent to which the components of the solder bond are out of alignment. The situation is shown in FIG. 6 wherein the vernier scales are shown in cross-section as relatively small bumps of solder 16, 26 attached to surfaces 2, 4 and with relatively large solder bumps 38 separating the two surfaces and bonding surfaces together to the metallisation pads 36. It has been determined that the ratio of the solder bump area to the metallisation pad area for the vernier scale is 1 to 1 whereas the bumps for the solder connection should be in the ratio 4 to 1. This results in a height of bond of about 35.5 microns whereas the calculated height of the vernier bumps is between 10 and 15 microns.

Thus the vernier structure illustrated in FIGS. 5, 6 and 7 comprises a series of aligned bars defined on each of the two components of the hybrid device in a region away from the solder bump array. These bars have slightly different spacings on the two components, say $S_1$ and $S_2$ ($S_1 > S_2$). The bars are defined in the solder wettable metallisation in the same lithographic and deposition sequence that defines the solder wettable pads for the solder bumps, and are thus precisely aligned with respect to these pads on each component. Solder is provided, then control of the solder application area must be exercised so that the total height of the soldered bars on the two components after solder reflow is less than the separation of the two components as defined by the main solder bump array (see FIGS. 5, 6 and 7). A number of such vernier structures may be located around the hybrid structure to provide alignment data in more than one axis (FIG. 7).

After flip chip solder bonding, the alignment of the two components may then be determined by visual examination of the vernier structure, defined in the solderable metal, if the sample is transparent to the optical microscopy method employed (visible or infrared), or, by X-ray radiography for non-transparent samples. In this latter case, a soldered vernier structure is employed, the solder providing good X-ray contrast. Real time, high resolution X-ray radiography equipment may be employed for rapid, in-line production monitoring of alignment by this method. Any misalignment of the two components results in the bars on the two halves of the vernier coinciding at a point away from the central bar of the vernier. The actual misalignment of components is given by $n(S_1 - S_2)$ if the two halves of the vernier coincide at the 'n'th bar from the center. The effective magnification of the vernier is $S_1/(S_1-S_2)$, and the resolution is $S_1-S_2$. In the example illustrated, the vernier bars are 12 μm in width, the main pitch of the vernier bars is 40 μm and the vernier can be used to read to a resolution of 2 μm, a resolution sufficient for many applications. The range of the vernier illustrated is ±400 μm and the whole structure occupies an area of only 240×840 μm.

What is claimed is:

1. A flip-chip solder bonding structure comprising first and second components each comprising a substrate having on one surface an array of solderable pads, selected pads having solder bumps deposited thereon, and each surface having a plurality of alignment marks formed thereon whereby when the components are positioned face to face, the arrays register with one another to enable a solder bond to be formed and the respective pluralities of alignment marks may be inspected to assess their relative positions in order to determine the accuracy of the solder bond, the solderable pads and the alignment marks on each surface being formed during the same processing stage as metallised regions and wherein solder bumps are applied to the metallised regions forming the alignment marks.

2. A structure as claimed in claim 1 wherein each plurality of alignment marks is formed as a row of marks spaced by a predetermined distance from one another.

3. A structure as claimed in claim 2 wherein each mark is formed as a bar extending laterally of the direction of the row of marks.

4. A structure as claimed in claim 3 wherein solder bumps are formed on the ends of the bars in a staggered array so that adjacent bars have solder bumps formed at opposite bar ends.

5. A structure as claimed in claim 2 wherein the rows of marks form a vernier scale and which cooperate when the bond is formed so that the degree of inaccuracy in the relative positions of the substrates can be determined by noting the distances of the aligned marks of the series of marks from a reference position.

6. A structure as claimed in claim 5 wherein one substrate surface has two rows of marks parallel to one another and spaced by a predetermined distance, the marks of each row having a similar spacing but the marks of one row being located midway between the marks of the other row, and wherein the other substrate surface has a further row of marks having a different spacing from said similar spacing, the further row of marks being positioned between the said two rows of marks when the bond is formed in order to define vernier scales with each of said two rows of marks.

7. A structure as claimed in claim 6 wherein a said vernier scale is formed along each side edge of a substrate surface.

* * * * *